United States Statutory Invention Registration [19]

[11] Reg. Number: H525

DeVore [43] Published: Sep. 6, 1988

[54] DEVICE FOR PROVIDING A CIRCUIT WITH RESISTIVE AND CAPACITIVE CHARACTERISTICS WHERE THE RESISTIVE CHARACTERISTIC IS CONTROLLABLE BY ELECTROMAGNETIC RADIATION

[75] Inventor: Thomas M. DeVore, Santa Barbara, Calif.

[73] Assignee: The United States of America as represented by the United States Department of Energy, Washington, D.C.

[21] Appl. No.: 3,524

[22] Filed: Jan. 15, 1987

[51] Int. Cl.[4] ..... G01T 1/22

[52] U.S. Cl. ..... 320/1; 250/370.01

[58] Field of Search ..... 320/1; 250/370, 315.3, 250/366; 372/38; 378/19; 323/902; 307/117

[56] References Cited

U.S. PATENT DOCUMENTS

| | | | |
|---|---|---|---|
| 1,899,026 | 2/1933 | Fessenden | 332/3 |
| 2,155,509 | 4/1939 | Schroeter | 358/217 |
| 3,426,209 | 2/1969 | Sihvonen et al. | 250/211 |
| 4,152,597 | 5/1979 | Sher | 250/370 |
| 4,213,797 | 7/1980 | Sher | 290/1 R X |
| 4,255,660 | 3/1981 | Blundell et al. | 250/370 |
| 4,663,526 | 5/1987 | Kamieniecki | 258/315.3 |
| 4,672,207 | 6/1987 | Derenzo | 250/370 X |

*Primary Examiner*—Stephen C. Buczinski
*Assistant Examiner*—Linda J. Wallace
*Attorney, Agent, or Firm*—Clifton E. Clouse, Jr.; Roger S. Gaither; Judson R. Hightower

[57] ABSTRACT

A dielectric body composed of mercuric iodide is placed between and in contact with two capacitor plates. Electrical conductivity of mercuric iodide increases with the intensity of light on the dielectric body. The dielectric body then forms a resistive path between the two capacitor plates. The two plates and the dielectric body therefore form the circuit equivalent of a capacitor in parallel with a resistor, where the resistance of the resistor is that of the dielectric body. The resistance of the body may be controlled by controlling the intensity of incident light. Charges on the capacitor plates may be discharged by illuminating the body with light of adequate intensity.

15 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

DEVICE FOR PROVIDING A CIRCUIT WITH RESISTIVE AND CAPACITIVE CHARACTERISTICS WHERE THE RESISTIVE CHARACTERISTIC IS CONTROLLABLE BY ELECTROMAGNETIC RADIATION

The Government has rights in this invention pursuant to contract No. DE-AC08-83N10282 EG&G.

BACKGROUND OF THE INVENTION

This invention relates to a device for providing a circuit with resistive and capacitive characteristics wherein the resistive characteristic is controllable by electromagnetic radiation. The invention is particularly advantageous for providing a light dischargeable capacitor.

In many electrical instruments it is desirable to provide capacitors which can be discharged remotely without making electrical contact. Electrometers are used to measure current from current sources. Typically, an electrometer includes a capacitor which is charged by a current from the current source. After the current is measured, the capacitor in the electrometer must be discharged so that the electrometer can be used for measuring other current sources. In order to discharge the capacitor, the conventional method is by mechanical switching. Mechanical switching is disadvantageous, however, since electrical contacts in the mechanical switches may breakdown after repeated usage and that mechanical switches may be costly. It is therefore desirable to provide a capacitor which can be discharged without electrical contacts. It may also be desirable to provide capacitors which can be discharged remotely since capacitors may be placed at locations that are difficult to reach.

In certain applications, it may be desirable to provide a device equivalent to a capacitor placed in parallel to a resistor where the resistance of the resistor can be optically controlled.

SUMMARY OF THE INVENTION

It is an object of this invention to provide a circuit with resistive and capacitive characteristics where the resistive characteristic is controllable by electromagnetic radiation.

A further object of the invention is to provide a capacitor which can be discharged without electrical contacts.

The above objects of the invention are solved herein as follows. The device of the invention comprises two electrically conductive elements spaced apart from each other suitable for holding electrical charges thereon. The device further comprises a dielectric body composed of mercuric iodide between and in contact with the two elements. The body and the two elements form a capacitor. The body also forms a charge and discharge resistive path between the two elements, where the path is in parallel to the capacitor. The path has an electrical conductance which increases with the intensity of electromagnetic radiation supplied to the body. The dielectric constant of the body, however, remains substantially unaffected by the intensity of electromagnetic radiation supplied to the body. The device also comprises means for supplying electromagnetic radiation to the body to control its electrical conductance.

By controlling the intensity of electromagnetic radiation on the body, a circuit is provided which has a substantially constant capacitance but a controllable resistance. To provide a capacitor dischargeable without electrical contacts, the conductance of the body and the intensity of the radiation supplied are such that the charges on the two elements are discharged through the body.

DETAILED DESCRIPTION OF THE INVENTION

The present invention is based on the recognition that when a dielectric body composed of mercuric iodide is placed in between and in contact with two capacitor plates, the dielectric body forms a charge and discharge resistive path between the two plates, resulting in a device which is equivalent to a capacitor is parallel with a resistor. When the dielectric body is then supplied with electromagnetic radiation such as light, the dielectric constant of the body does not change but its electrical conductance increases with the intensity of the electromagnetic radiation. In this manner the device comprising the two capacitor plates and the body forms a capacitor in parallel with a resistor whose resistance decreases with the intensity of electromagnetic radiation supplied. The resistance of the resistor can then be controlled by varying the intensity of the radiation supplied.

Figure 1:
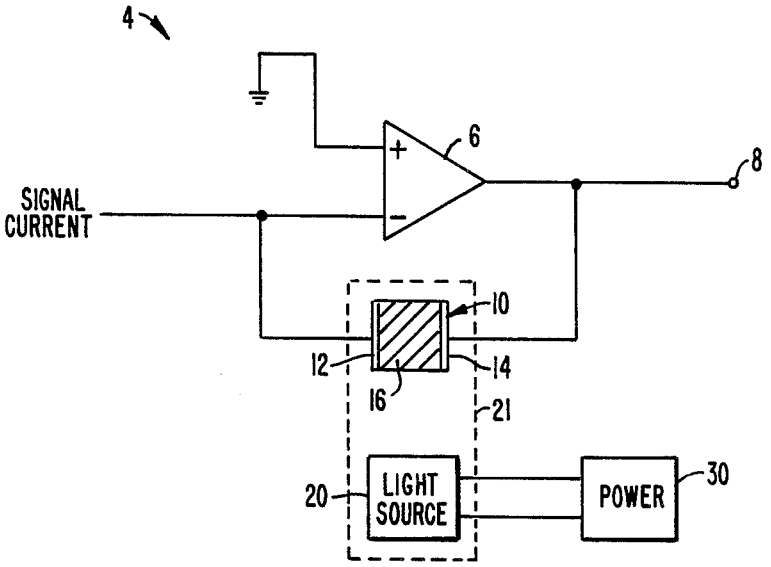
FIG. 1 is a schematic view of an electrometer which includes a capacitive and resistive device and a light source with associated circuitry to illustrate the preferred embodiment of the invention.

FIG. 1 is a schematic view of an electrometer which includes a capacitive and resistive device and a light source with associated circuitry to illustrate the preferred embodiment of the invention. In reference to FIG. 1, electrometer 4 includes an operational amplifier 6, device 10, light source 20 and power supply 30. Device 10 has both capacitive and resistive characteristics. As shown in FIG. 1, device 10 is placed in a negative feedback path of amplifier 6, whose non-inverting input is connected to ground. A signal current is also fed to the inverting input of the amplifier. The signal current charges device 10 and appears at the output 8 of the electrometer as a voltage.

After the signal current is measured as a voltage appearing at terminal 8, it is desirable to discharge device 10 so that electrometer 4 may be used to measure other signal currents. In conventional electrometers, device 10 usually comprises a capacitor and a mechanical switch used to discharge the capacitor. As explained above, the use of mechanical switches is disadvantageous. The construction of device 10 is described in more detail below.

In reference to FIG. 1 device 10 comprises two electrically conductive elements 12 and 14 spaced apart from each other suitable for holding electrical charges thereon. In the preferred embodiment elements 12 and 14 are capacitor plates. A dielectric body 16 composed of mercuric iodide is placed in between and in contact with elements 12 and 14, the body and the two elements forming a capacitor. Body 16 also forms a charge and discharge resistive path between the two elements. Device 10 is therefore the circuit equivalent of a capacitor (with elements 12, 14, 16) in parallel with a resistor whose resistance is that of body 16. While in FIG. 1 body 16 is shown to fill up the space between elements 12 and 14, it will be understood that body 16 may take on other shapes as well, with the remaining space between the two elements taken up by other material. While such altered configuration changes the capacitance of device 10, it does not alter the characteristic of device 10 in being equivalent to a capacitor in parallel with a resistor.

Mercuric iodide has the property that its electrical conductance increases linearly with the intensity of light shining thereon, where the light should have wavelengths in the range of about 300–600 nanometers. Mercuric iodide is a photoconductor with an external quantum efficiency of roughly 50% for photons with energy greater than the materials ban-gap energy of about 2.1 eV. The time required for the conductance or the resistance of body 16 to change with the variation of the incident light intensity or level varies with the square of the thickness of body 16, inversely with the voltage applied to elements 12 and 14, and inversely with the light level. In any given configuration of device 10, the response time is determined experimentally. Typical response times might be in the range of a few microseconds.

In principle the conductance and resistance of body 16 will respond to essentially any light level and irrespective of whether the light is at a constant or varying level. To obtain useful results, however, it is preferable for the light supplied by the light source to be at moderate light levels, for example, at a few hundred microwatts per square centimeter. Thus, as shown in FIG. 1 light source 20 supplies light of the appropriate wavelength and intensity to body 16.

Mercuric iodide, as a dielectric material, has the advantage that its dielectr1c constant remains substantially unchanged with the intensity of the incident light, in contrast to its conductivity. Capacitance of device 10 may be increased by either reducing the thickness of body 16 (which also reduces response time) or increasing the surface area of device 10, or both.

As illustrated in FIG. 1, one particularly advantageous use of device 10 is as a capacitor which can be discharged without making any electrical contacts. Thus, elements 12 and 14 may be charged by means of a signal current. The charges on elements 12 and 14 can be discharged by supplying light to body 16 using light source 20. When light of a sufficient intensity (such as a few hundred microwatts per square centimeter) is supplied to body 16, the charges on elements 12 and 14 are discharged. Thus, device 10 is discharged without making or breaking any electrical contacts which may cause electrical noise. Such features are particularly desirable for applications where avoiding electrical noise is important. To prevent ambient light from unintentionally discharging device 10, it is preferable to enclose the device and light source 20 in an opaque container 21 shown in dotted lines in FIG. 1. Where device 10 is used as a light dischargeable capacitor, device 10 is either kept in darkness to prevent discharge or illuminated with light of sufficient intensity to discharge it, as illustrated above in reference to an electrometer.

Figure 3:
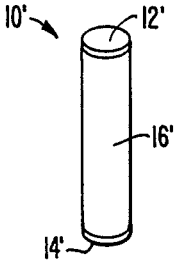
FIG. 3 is a graphical illustration of the intensities of radiation supplied by the light source of FIG. 1.

FIG. 3 is a perspective view of an implementation of device 10 of FIG. 1 to illustrate the preferred embodiment of the invention. As shown in FIG. 3, the implementation 10′ of the device comprises two conductive plates 12′, 14′ separated but in contact with a dielectric body 16′ made of mercuric iodide. Body 16′ is elongated to maximize its surface area for receiving light. In one implementation, body 16′ is about 1 cm. in length between plates 12′, 14′, where plates 12′, 14′ are each about 0.1 sq. cm. in area. When a current of a few milliamperes is supplied to a LED light source supplying light to device 10′, device 10′ is discharged in about 2 microseconds. The light emitted by the LED is about 600 nanometers in wave length.

While mercuric iodide in the form of single crystals have been found to be satisfactory for the purposes described herein, it is believed that polycrystaline mercuric iodide may also be used. Mercuric iodide used should be in tetragonal form (red phase) which is the stable, usable form at room temperature. Single crystals are vapor grown (by condensing a vapor into crystals in the red phase) and then sliced into wafers. Single crystal mercuric iodide can be obtained from EGG EMG, Post Office Box 1912, Las Vegas, Nev. 89125.

For the purpose of providing a capacitor dischargeable without making electrical contacts, mercuric iodide is a particularly desirable material to be used as a dielectric. The resistivity of mercuric iodide in the dark is about $10^{13}$ to $10^{14}$ ohm-cm, which is higher than those of many other light sensitive materials. For example, the dark resistivity of mercuric iodide is believed to be several orders of magnitude higher than that of selenium. The response time of device 10 using mercuric iodide for body 16 is also faster than when many other types of materials are used for body 16.

Figure 2:
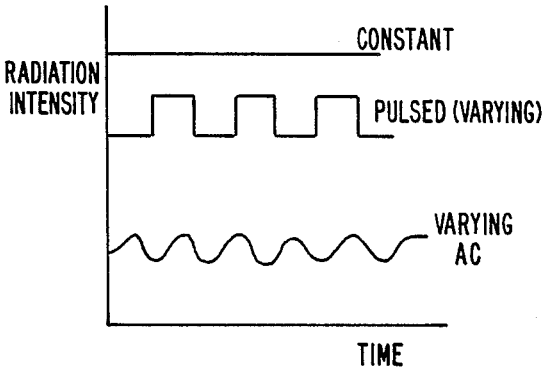
FIG. 2 is a perspective view of one implementation of the device of FIG. 1 to illustrate the preferred embodiment of the invention.

Light source 20 may be any appropriate light source such as a LED supplied with current from a power supply 30. As indicated earlier, the light from light source 20 may be of a constant or varying (such as pulsed) level as illustrated in FIG. 2. To cause a LED to emit light of a constant or varying level, power supply 30 supplies a constant or varying current to the LED.

Figure 4:
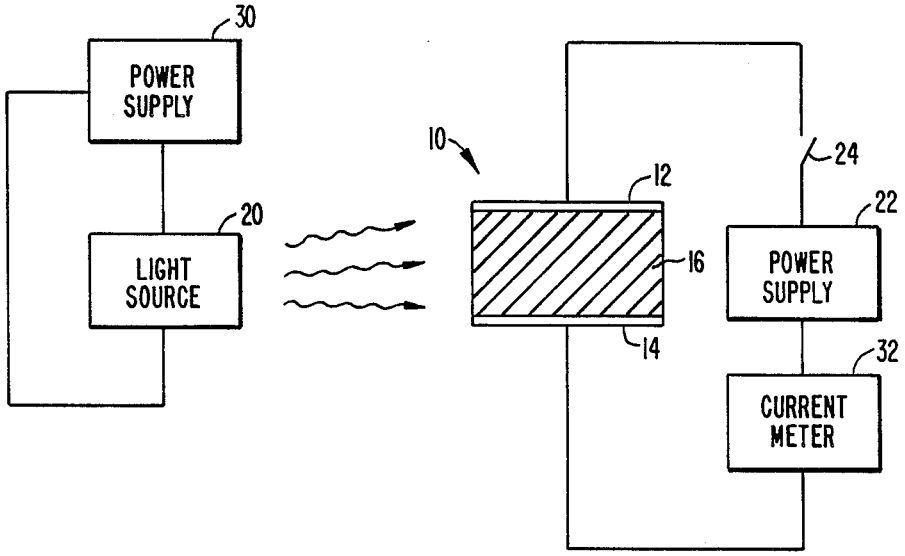
FIG. 4 is a schematic circuit diagram of a capacitive and resistive device and a light source illustrating another aspect of the invention.

When device 10 is used as a circuit with a capacitor with constant capacitance and a resistor with variable resistance placed in parallel as shown in FIG. 4, the intensity of light from light source 20 is used to control the value of the resistance of the resistor (equal to that of body 16) in such equivalent circuit. The capacitance of the capacitor in such equivalent circuit is equal to that of device 10. Device 10 is charged by power supply 22 and the current through it measured by meter 32. As elaborated above, the capacitance of device 10 does not change with changes in the intensity of light from source 20. The precise characteristics of light intensities required to give the desired resistance values are determined experimentally with a given configuration of device 10. Light intensities varying in a desirable manner (such as one shown in FIG. 2) may be used to obtain a desired capacitive and resistive circuit characteristic where the conductance of the circuit will vary in a manner similar to that of light intensity.

The invention is also advantageous for applications in resettable sample and hold circuits, pico-ammeter integrators, current to frequency converters and pulsed optical feedback charge sensitive preamplifiers.

The above description of the invention is merely illustrative thereof and various changes in the materials and the details in the construction and method may be within the scope of the appended claims.

What is claimed is:

1. A system comprising:

a circuit which includes a device with resistive and capacitive characteristics wherein the resistive characteristic is controllable by exposure to electromagnetic radiation, said device comprising:

(a) two electrically conductive elements spaced apart from each other suitable for holding electrical charges thereon; and (b) a dielectric body composed of mercuric iodide between and in contact with the two elements, the body and the two elements forming a capacitor, said body also forming a charge and discharge resistive path between the two elements and in parallel to the capacitor, said path having an electrical conductance which increases with the intensity of electromagnetic radiation supplied to the body and wherein the dielectric constant of the body remains substantially unaffected by the radiation intensity; and means for supplying electromagnetic radiation to the body to control its electrical conductance, thereby controlling the circuit without making or breaking any electrical contacts.

2. The system of claim 1, wherein the body is such that when electromagnetic radiation of wavelengths substantially within the range 300 to 600 nanometers is supplied to the body, charges stored in the two elements are discharged through the body, so that the device is dischargeable without making or breaking electrical contacts.

3. The system of claim 2, wherein the body is such that said device is dischargeable by electromagnetic radiation of a few hundred microwatts per square centimeter in intensity.

4. The system of claim 1, wherein said body is composed of single crystals of mercuric iodide.

5. The device system of claim 4, wherein said single crystals are vapor grown.

6. The system of claim 1, wherein said body is composed of polycrystaline mercuric iodide.

7. The system of claim 1, wherein said means for supplying electromagnetic radiation is electrically insulated from the device and supplies radiation to the body of such intensity that charges stored on the two elements are discharged through the body, so that the device is dischargeable without electrical contacts.

8. The system of claim 7, wherein said means for supplying electromagnetic radiation supplies light of a few hundred microwatts per aquare centimeter in intensity.

9. The system of claim 1, wherein said means for supplying electromagnetic radiation supplies light of wavelengths substantially in the range 300–600 nanometers.

10. The system of claim 1, wherein said means for supplying electromagnetic radiation supplies photons to the body, and wherein at least some of the the photons have energies greater than about 2.1 ev.

11. A method for discharging a capacitor, said capacitor including two electrically conductive elements spaced apart from each other and suitable for holding electrical charges thereon, and dielectric body composed of mercuric iodide between and in contact with the two elements, wherein the electrical conductance of the body increases with the intensity of electromagnetic radiation supplied to it and wherein the dielectric constant of the body remains substantially unaffected by the radiation intensity, said method comprising supplying electromagnetic radiation to the body of such intensity that charges stored on the two elements are discharged through the body, so that the capacitor is dischargeable remotely and without electrical contacts.

12. The method of claim 11, wherein the radiation supplying step supplies radiation of a substantially constant intensity.

13. The method of claim 11, wherein the radiation supplying step supplies radiation of a varying intensity.

14. The method of claim 13, wherein the radition supplying step supplies radiation of a pulsed waveform.

15. The method of claim 11, wherein the radiation supplying step supplies radiation of a wavelength substantially in the range of 300–600 nanometers.

* * * * *